(12) United States Patent
Masuda

(10) Patent No.: US 6,239,638 B1
(45) Date of Patent: May 29, 2001

(54) SR FLIP FLOP

(76) Inventor: Tatsuji Masuda, 3-22, Asouda-mati 3-Chome, Matsuyama-shi, Ehime-ken 790-0952 (JP)

( * ) Notice: Subject to any disclaimer, the term of this patent is extended or adjusted under 35 U.S.C. 154(b) by 0 days.

(21) Appl. No.: 09/254,415

(22) PCT Filed: Jul. 1, 1998

(86) PCT No.: PCT/JP98/02959

§ 371 Date: Apr. 21, 1999

§ 102(e) Date: Apr. 21, 1999

(87) PCT Pub. No.: WO99/03204

PCT Pub. Date: Jan. 21, 1999

(30) Foreign Application Priority Data

Jul. 8, 1997 (JP) .................................................. 9-216915

(51) Int. Cl.⁷ .............................................. H03K 3/037
(52) U.S. Cl. ......................... 327/199; 327/200; 327/217
(58) Field of Search .................................... 327/199, 200, 327/201, 215, 217, 220, 504

(56) References Cited

U.S. PATENT DOCUMENTS

| | | | |
|---|---|---|---|
| 2,879,412 | * 3/1959 | Hoge et al. | 327/220 |
| 3,131,311 | * 4/1964 | Ross | 327/199 |
| 3,427,563 | * 2/1969 | Lasher | 327/199 |
| 3,588,736 | * 6/1971 | McGroddy | 331/47 |

FOREIGN PATENT DOCUMENTS

| | | |
|---|---|---|
| 59-211283 | 11/1984 | (JP) . |
| 59-211284 | 11/1984 | (JP) . |
| 60-49678 | 3/1985 | (JP) . |
| 61-142777 | 6/1986 | (JP) . |
| 5-50149 | 7/1993 | (JP) . |
| 5-60270 | 9/1993 | (JP) . |
| 8-79022 | 3/1996 | (JP) . |

OTHER PUBLICATIONS

"Dynamics of the Single Barrier Heterostructure Hot Electron Diode", Aug. 15, 1997, by A. Reklaitis et al., pp. 1706–1710.

"Negative Differential Conductance in Three–Terminal Silicon Tunneling Device"; Jul. 9, 1996; by Junji Koga et al., pp. 1435–1437.

IEE Proceedings–G, vol. 140, No. 6, Dec. 1993 "Logic Design Based on Negative Differential Resistance Characteristics of Quantum Electronic Devices", by S. Mohan et al., pp. 383–391.

"Impedance Properties of High–Frequency PIN Diodes," Solid–State Electronics, vol. 42, No. 1, pp. 121–128, 1998, by I. V. Lebedev et al.

* cited by examiner

*Primary Examiner*—Kenneth B. Wells
*Assistant Examiner*—Paul Dinh
(74) *Attorney, Agent, or Firm*—Parkhurst & Wendel, L.L.P.

(57) ABSTRACT

A SR flip-flop using a device which has negative resistance between two output electrodes provided on one of two semiconductor regions in a fixed reversible reverse breakdown condition of the semiconductor junction formed between the two semiconductor regions. The SR motion is controlled by applying trigger pulses directly to two output electrodes. In this manner, the circuit is simplified and the operation speed is raised.

4 Claims, 1 Drawing Sheet

SR FLIP FLOP

TECHNICAL FIELD

The invention relates to SR flip-flop using a device which has negative resistance between two output electrodes provided on one of two semiconductor regions in a fixed reversible reverse breakdown condition of the semiconductor junction formed between the two semiconductor regions.

BACKGROUND ART

A conventional SR flip-flop has been made by the circuit of a feedback device using three terminal two active devices. As a result, the device has complexity circuit structure and its operation speed cannot be reduced. To settle these problems, the SR flip-flop of the present invention is constructed by the bistable circuit using the device, which is disclosed in U.S. Pat. No. 5,229,636 or JP PATENT DOCUMENT 5-60270.

SUMMARY OF THE INVENTION

The present invention uses a semiconductore device as an active device of the SR flip-flop. The semiconductor device comprises a first semiconductor region of first conductivity type and a second semiconductor region of second conductivity type and two output electrodes in the first semiconductor region and an electrode in the second semiconductivity region which applies with two output electrodes the breakdown voltage in reverse direction to semiconductor junction formed between first and second semiconductor regions. Semiconductor device has bistable output at two output electrodes which is based on the negative resistance generated between the two output electrodes in a fixed reversible reverse breakdown condition of the said semiconductor junction.

Here, the first and second semiconductor region have an area such that carriers which have been accelerated in the depletion region of semiconductor junction maintain their high energy condition. For example, it is less than about 10 $\mu$m on a side of the rectangle for the stretch and less than about 1 $\mu$m for the thickness in the planar structure.

The bistable circuit using semiconductor device is hence fabricated as follows. Namely, each one side terminal of two identical resistors are connected respectively to electrodes in the region. An electrical power source is connected between the common terminal of the other sides of two identical resistors and electrode in another region which applies a predetermined voltage to the junction.

The SR flip-flop of the present invention is constructed based on this bistable circuit. Namely, the output terminals of two identical trigger pulse generators are connected respectively to electrodes of the bistable circuit directly or through resistive or capasitive devices. In this construction, the bistable output at two output electrodes in a fixed reversible reverse breakdown condition of the semiconductor junction through which the settled power current is flowing is displayed.

The arrangement of SR flip-flop motion is explained as follows. The trigger pulses generated by two generators is first set to be a '1' condition. And, when one of the electrodes has the trigger pulse applied by the corresponding generators 9 or 10, its electrical potential condition has been turned over, and therefore it is set that the condition before the bistable condition turned over is a '0' condition and the condition after the bistable condition turned over is a '1' condition.

The explanation of the practical motion is as follows. For example, in the case where the bistable condition of the electrical potential of one electrode is low and that of the other electlode is high, the closed current is flowing along the circuit formed by the circular sequence of the other electrode, resistor, electrode and region. Trigger pulses of '1' are positive trigger pulses. In this condition, when only the second electrode has been applied a trigger pulse '1' by a generator, the closed current flowing through the second electrode decreases in an instant. This decreasing of the current weakens the contribution to the negative resistance in the near area of the second electrode of both the minority carriers of low energies which has not yet been accelerated in the depletion region of the semiconductor junction and the majority carriers of high energies which has been accelerated in the depletion region.

This decline drives the bistable condition of the device to turn over. Then, the electrical potential of changes from high condition '0' to low condition '1'.

In the other elementary case of SR motion where the trigger pulses '1' are applied to two electrodes, the driving effects are mutually canceled and the bistable condition does not turn over. As well, in the case that the trigger pulses '1' are not applied to both electrodes, the bistable condition is not turned over.

In this way, the SR motion is carried out precisely by applying trigger pulses '1' directly to the two output electrodes.

DETAILED DESCRIPTION

Figure 1:
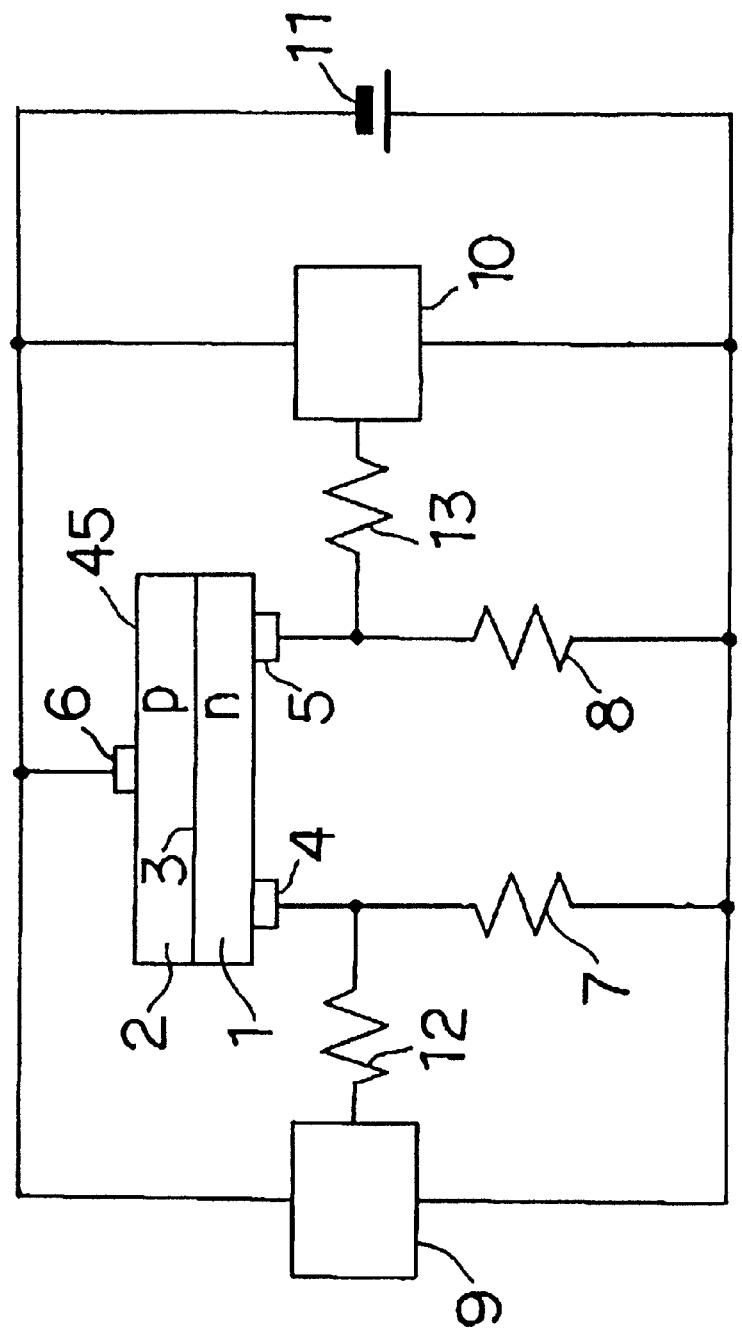
FIG. 1 is a simplified diagram illustrating the preferred circuit construction of a SR flip-flop in accordance with the present invention.

FIG. 1 shows a simplified diagram illustrating the best form of a circuit construction of a SR flip-flop in accordance with the present invention.

As shown in FIG. 1, semiconductor device 45 comprises first semiconductor region 1 of n type conductivity and second semiconductor region 2 of p type conductivity and two output electrodes 4 and 5 in first semiconductor region 1 and electrode 6 in second semiconductor region 2. Semiconductor junction 3 is formed between first and second semiconductor regions 1 and 2. Electrode 4 is connected to one side terminal of resistor 7 and to the output terminal of negative pulse generator 9 through a second resistor 12. Electrode 5 is connected to one side terminal of resistor 8 and to the output terminal of negative pulse generator 10 through second resistor 13. The resistance of identical resistors 12 and 13 is larger than of identical resistors 7 and 8. Electrical power source 11 is coupled between the common terminal of the other sides of two identical resistors 7 and 8 and electrode 6 which is biasing pn junction 3 by reversible breakdown voltage in a reverse direction. Generators 9 and 10 have the same power source 11 as device 45. The base electrical potential of the negative trigger pulses generated by generators 9 and 10 is made to be between the bistable output potential at electrodes 4 and 5. In this construction, device 45 displays the bistable output at two output electrodes 4 and 5 in a fixed reversible reverse breakdown condition of the semiconductor junction 3 through which the settled power current is flowing.

In this condition, the motion of the SR flip-flop is explained as follows. For example, in the bistable condition where the electrical potential of electrode 4 is low and that of electrode 5 is high, the closed current which is generated by the negative resistance between electrode 4 and 5 is flowing along the circuit formed by the circular sequence of electrode 5, resistor 8, 7, electrode 4 and region 1. Here, since the base electrical potential of the trigger pulses is the between the bistable output potentials, the current which is flowing along to the same direction as the closed current is flowing on one hand from high potential electrode 5 to negative trigger pulse generator 10 and on the other hand from negative trigger pulse generator 9 to low potential electrode 4. This current is made to be smaller than the closed current so that the bistable condition can be maintained. And the negative trigger pulses generated by the generator 9 and 10 are very small. In this condition, when only low potential electrode 4 has been applied with a negative trigger pulse '1' of set pulse by generator 9, the closed current flowing into electrode 4 decreases in an instant. This decreasing of the current has an effect that the number of holes, minority carriers, injected from electrode 4 to region 1 instantaneously decreases and that the number of electrons, majority carriers, injected from region 1 to electrode 4 instantaneously decreases, and so has an effect of weakening the numeral contribution to the negative resistance near the area of electrode 4 of both the minority carriers of low energies and the majority carriers of high energies.

This decline drives the bistable condition of device 45 to turn over, and then, the electrical potential of electrode 4 changes from low condition '0' to high condition '1' of set condition.

Next when only electrode 5 becomes low potential, a negative trigger pulse '1' of reset pulse is applied by generator 10. The closed current flowing into electrode 5 at this time decreases instantaneously and then, the bistable condition has turned over, resulting in that the electrical potential of electrode 5 changes from low condition '0' to high condition '1' of the reset condition.

Where the negative trigger pulses '1' are applied to both electrodes 4 and 5, the driving effects are mutually canceled and the bistable condition does not turn over. And in the case where the negative trigger pulses '1' are not applied to both electrodes 4 and 5, the bistable condition does not turn over.

In these ways, the SR motion is carried out precisely by applying very small trigger pulses '1' directly to two output electrodes 4 and 5.

As explained above, the SR flip-flop of the present invention has a simplified circuit since it uses the semiconductor device which has bistable output based on the negative resistance generated between the two output electrodes provided in one of the two semiconductor regions in a fixed reversible reverse breakdown condition of the semiconductor junction formed by the two semiconductor regions. The best use of the high speed faculty of the semiconductor device can be made since the bistable outputs can be controlled by applying directly very small trigger pulses to the two output electrodes. Further, since the reversible reverse breakedown voltage of the junction can be settled in a wide range and since the semiconductor device and the circuit is constructed by silicon semiconductor, the circuit can be integrated.

What is claimed is:

1. A SR flip-flop comprising:

(a) a semiconductor device including:

a first semiconductor region having a first conductivity type and a second semiconductor region having a second conductivity type, said two semiconductor regions forming a semiconductor junction therebetween, said semiconductor junction being reversibly biased in the reverse direction by breakdown voltage, said two semiconductor regions are limited within areas near said depletion region of said semiconductor junction such that carriers accelerated in said depletion region maintain an unscattered high energy condition;

two output electrodes provided on said first semiconductor region, said two output electrodes reversibly applying said breakdown voltage to bias said semiconductor junction;

one electrode provided on said second semiconductor region, said one electrode reversibly applying said breakdown voltage to bias said semiconductor junction with said two output electrodes wherein a bistable condition is obtained at each of said two output electrodes in a fixed reversible reverse breakdown condition in said reverse direction to said semiconductor junction;

two identical first resistors, one side terminal of said two identical first resistors being connected to each of said two output electrodes; and an electrical power source coupled between the common terminal of the other side of said two identical first resistors and said one electrode in said reverse direction to said semiconductor junction, said power source providing the voltage to reversibly bias said semiconductor junction by said breakdown voltage in said reverse direction; and (b) two identical trigger pulse generators, said two identical trigger pulse generators comprising negative trigger pulse generators each having an output terminal each output terminal being connected to said two output electrodes respectively wherein the motion of SR flip-flop is obtained between said two output electrodes by applying the trigger pulses of said two identical negative trigger pulse generators in said bistable condition.

2. A SR flip-flop comprising:

(a) a semiconductor device including:

a first semiconductor region having a first conductivity type and a second semiconductor region having a second conductivity type, said first conductivity type is p-type and said second conductivity type is n-type, said two semiconductor regions forming a p-n semiconductor junction therebetween, said p-n semiconductor junction being reversibly biased by breakdown voltage in the reverse direction, said two semiconductor regions being limited within areas near a depletion region of said p-n semiconductor junction such that carriers accelerated in said depletion region maintain an unscattered high energy condition;

two output electrodes provided on said p-type semiconductor region, said two output electrodes reversibly applying said breakdown voltage to bias said p-n semiconductor junction;

one electrode provided on said n-type semiconductor region, said one electrode reversibly applying said breakdown voltage to bias said p-n semiconductor junction with said two output electrodes wherein a bistable condition is obtained at each of said two output electrodes in a fixed reversible reverse breakdown condition in said reverse direction to said p-n semiconductor junction;

two identical first resistors, one side terminal of said two identical first resistors being connected to each of said two output electrodes; and an electrical power source coupled between the common terminal of the other side of said two identical first resistors and said one electrode in said reverse direction to said p-n semiconductor junction, said power source providing voltage to reversibly bias said p-n semiconductor junction by said breakdown voltage in said reverse direction; and (b) two identical trigger pulse generators each having an output terminal, each output terminal being connected to said two output electrodes respectively wherein the motion of SR flip-flop is obtained between said two output electrodes by applying the trigger pulses of said two identical trigger pulse generators in said bistable condition.

3. A SR flip-flop according to claim 2 wherein said two identical trigger pulse generators are generators of positive trigger pulse.

4. A SR flip-flop according to claim 2 wherein said two identical trigger pulse generators are generators of negative trigger pulse.

* * * * *